(12) United States Patent
Kokubun

(10) Patent No.: US 11,545,511 B2
(45) Date of Patent: Jan. 3, 2023

(54) LIGHT RECEIVING DEVICE, MANUFACTURING METHOD OF LIGHT RECEIVING DEVICE, AND DISTANCE MEASURING APPARATUS

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Koichi Kokubun, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 314 days.

(21) Appl. No.: 16/806,497

(22) Filed: Mar. 2, 2020

(65) Prior Publication Data
US 2021/0043669 A1    Feb. 11, 2021

(30) Foreign Application Priority Data
Aug. 6, 2019  (JP) .............................. JP2019-144670

(51) Int. Cl.
*H01L 21/00* (2006.01)
*H01L 27/146* (2006.01)
(Continued)

(52) U.S. Cl.
CPC .... *H01L 27/14612* (2013.01); *H01L 27/1446* (2013.01); *H01L 31/02161* (2013.01); *H01L 31/107* (2013.01)

(58) Field of Classification Search
CPC .......... H01L 27/14612; H01L 27/1446; H01L 31/02161; H01L 31/107
See application file for complete search history.

(56) References Cited

U.S. PATENT DOCUMENTS 5,523,610 A * 6/1996 Kudo .................. H01L 27/1446
                                                 438/81
5,567,974 A * 10/1996 Yoshitake ........... H01L 27/1446
                                                 257/446

(Continued)

FOREIGN PATENT DOCUMENTS

JP      2018156984       10/2018

*Primary Examiner* — Richard A Booth
(74) *Attorney, Agent, or Firm* — Kim & Stewart LLP

(57) ABSTRACT

A light receiving device comprises a substrate of a first type on a first electrode, a first region of the first type on the substrate, second regions of the first type arrayed on the first region, and third regions of a second type on the second regions. A first isolation portion is between the adjacent second regions and adjacent third regions. A second isolation portion comprising a metal is embedded the first isolation portions. A fourth region of the second type is on the first region and spaced from the second regions in a second direction with a pair of fifth regions thereon. An insulating film is on the fourth region and the pair of fifth regions. A second electrode is on the insulating film between the pair of fifth regions. The second electrode is comprised of the same metal as the second isolation portion.

20 Claims, 7 Drawing Sheets

(51) Int. Cl.
H01L 27/144 (2006.01)
H01L 31/0216 (2014.01)
*H01L 31/107* (2006.01)

(56) References Cited

U.S. PATENT DOCUMENTS

| | | | | |
|---|---|---|---|---|
| 5,633,526 | A | * | 5/1997 | Kudo .................. H01L 27/1446 |
| | | | | 257/431 |
| 6,049,117 | A | * | 4/2000 | Fukunaga ....... H01L 31/035281 |
| | | | | 257/446 |
| 8,847,245 | B2 | | 9/2014 | Kurokawa |
| 2012/0068289 | A1 | | 3/2012 | Alie et al. |
| 2018/0269236 | A1 | | 9/2018 | Sasaki |

* cited by examiner

CROSS-SECTIONAL VIEW TAKEN ALONG LINE B-B

CROSS-SECTIONAL VIEW TAKEN ALONG LINE C-C

CROSS-SECTIONAL VIEW TAKEN ALONG LINE B-B

CROSS-SECTIONAL VIEW TAKEN ALONG LINE C-C

LIGHT RECEIVING DEVICE, MANUFACTURING METHOD OF LIGHT RECEIVING DEVICE, AND DISTANCE MEASURING APPARATUS

CROSS-REFERENCE TO RELATED APPLICATION

This application is based upon and claims the benefit of priority from Japanese Patent Application No. 2019-144670, filed Aug. 6, 2019, the entire contents of which are incorporated herein by reference.

FIELD

Embodiments described herein relate generally to a light receiving device, a manufacturing method of a light receiving device, and a distance measuring apparatus.

BACKGROUND

A light receiving device in which avalanche photodiodes, which are a kind of photoelectric transducer, are connected in parallel and the number of incident photons is measured is known. It is desirable to prevent noise due to crosstalk between adjacent photoelectric transducers while achieving high light-receiving sensitivity.

DETAILED DESCRIPTION

Figure 1A:
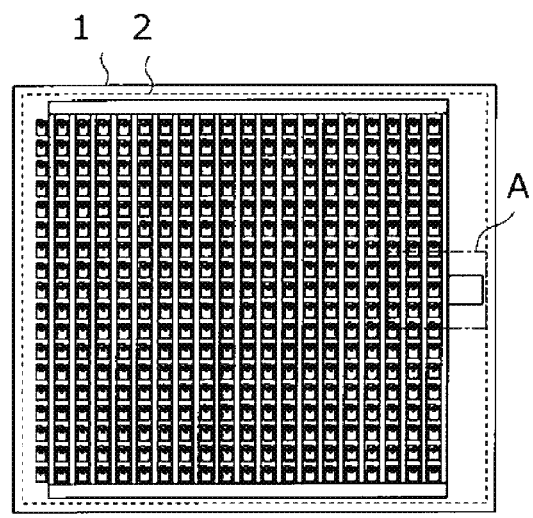
FIG. 1A is a plan view illustrating an example of a configuration of a light receiving device according to a first embodiment.

Certain example embodiments provide a light receiving device and a distance measuring apparatus with reductions in noise due to crosstalk between adjacent photoelectric transducers and having high light-receiving sensitivity. A manufacturing method for a light receiving device is also disclosed.

In general, according to one embodiment, a light receiving device includes a first electrode, a semiconductor substrate of a first conductivity type on the first electrode, a first semiconductor region of the first conductivity type on the semiconductor substrate, a plurality of second semiconductor regions of the first conductivity type arrayed on the first semiconductor region in a first direction, and a plurality of third semiconductor regions of a second conductivity type respectively on the plurality of second semiconductor regions. A first isolation portion is between each of the plurality of second semiconductor regions adjacent to each other in the first direction and between each of the plurality of third semiconductor regions adjacent to each other in the first direction. The first isolation portion is an electrical insulator. A second isolation portion is embedded in each of the first isolation portions. The second isolation portions comprise a metal. A fourth semiconductor region of the second conductivity type is on the first semiconductor region and spaced from the second semiconductor region in a second direction. A pair of fifth semiconductor regions of the first conductivity type is on the fourth semiconductor region spaced from each other in the second direction. An insulating film is on the fourth semiconductor region and the pair of fifth semiconductor regions. A second electrode is on the insulating film between the pair of fifth semiconductor regions. The second electrode is comprised of the same metal as the second isolation portion.

Hereinafter, a photoelectric transducer and a distance measuring apparatus according to example embodiments will be described by reference to the accompanying drawings. It is noted that the present disclosure is not limited to these example embodiments. The views of the light receiving device (s) used in the following description are schematic, and any depicted relationship between a thickness and a width of a layer, a ratio of the thickness of each layer, or the like are not limitations of the present disclosure. The dimension (s) and the number of each element or aspect depicted in the drawings are, in general, schematic and possible embodiments are not limited to those illustrated in the drawings.

In the specification, a "P$^+$" label or description of a semiconductor region or portion indicates a P-type conductivity (e.g., inclusion of a P-type dopant or impurity), which refers to an effective impurity concentration of the region being higher than that of a semiconductor region or portion labeled or described as "P". Similarly, "P$^-$" label or description of a semiconductor region or portion indicates an effective P-type impurity concentration that is less than the region or portion labeled or described as "P" only. In this, context, the "effective impurity concentration" refers to a concentration of impurities that contribute to conductivity of semiconductor material. When the semiconductor material contains both an impurity which acts as a donor and an impurity which acts as an acceptor, the effective impurity concentration refers to a net concentration including any possible offset between the donor and the acceptor concentrations.

First Embodiment

Figure 1B:
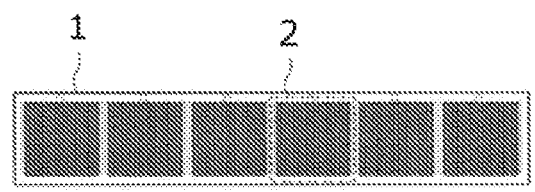
FIG. 1B is a plan view illustrating another example configuration of a light receiving device of a first embodiment in which pixels are linearly arranged.
Figure 1C:
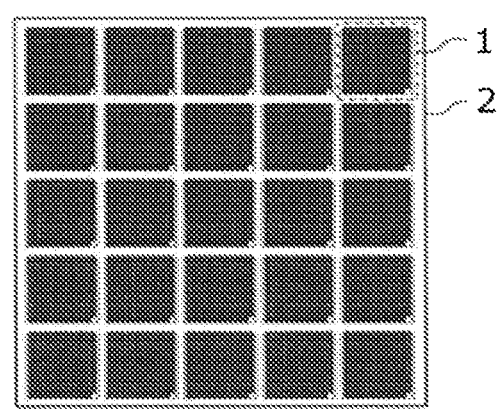
FIG. 1C is a plan view illustrating an example of still another example of a light receiving device of a first embodiment in which pixels are arranged in a matrix.

FIG. 1A is a plan view illustrating an example of a configuration of a light receiving device 1 of the first embodiment when seen from the light incident surface side. FIG. 1B is a plan view illustrating an example of another configuration of the light receiving device 1 of the first embodiment in which pixels 2 are linearly arranged. FIG. 1C is a plan view illustrating an example of still another configuration of the light receiving device 1 of the first embodiment in which pixels 2 are arranged in a matrix. One direction in the plane/page of the drawing is an X-direction, a direction orthogonal to the X-direction in the plane/page of the drawing is a Y-direction, and a direction orthogonal to the X-direction and the Y-direction is a Z-direction.

As illustrated in FIG. 1A, the light receiving device 1 includes a pixel 2 on which light can be incident. The pixel 2 performs photoelectric conversion. In each pixel 2, a large number of photoelectric transducers are arranged in a matrix configuration. The light receiving device 1 may include a plurality of pixels 2 linearly arranged, as illustrated in FIG. 1B, or a plurality of pixels 2 arranged in a matrix configuration, as illustrated in FIG. 1C. FIG. 1A to FIG. 1C schematically illustrate arrangements and numbers of the pixels 2 (and photoelectric transducers 3 described later; see e.g., FIG. 2), but the arrangement and the number of the pixels 2 (and photoelectric transducers 3 therein) are not limited to these examples.

Figure 2:
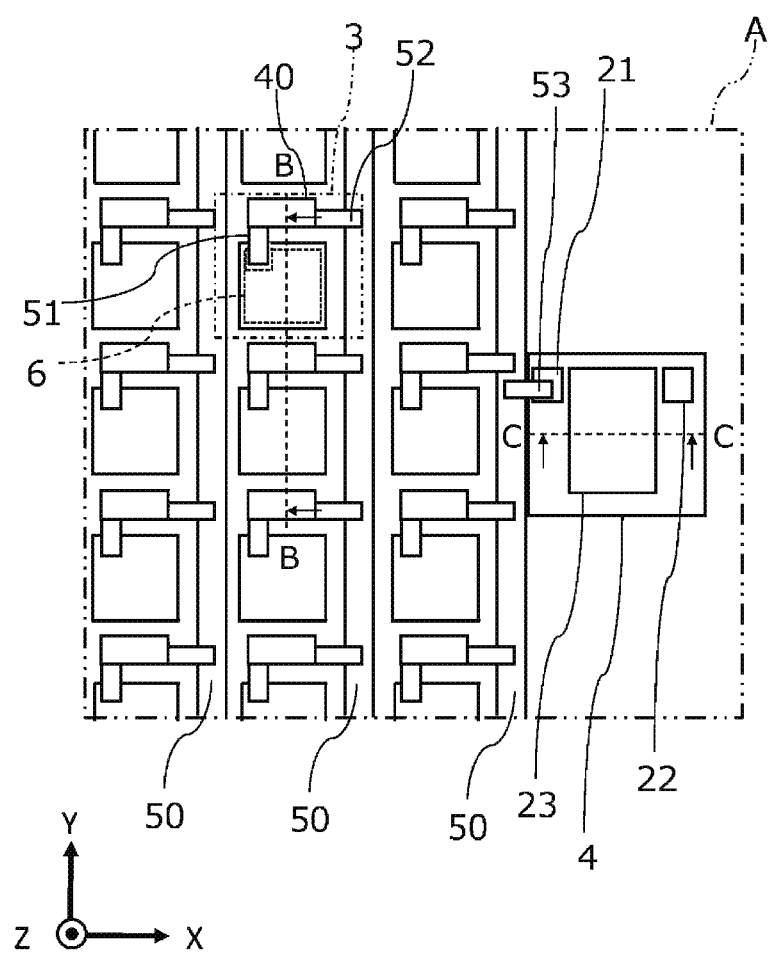
FIG. 2 is a plan view illustrating an example of a pixel in a first embodiment.

FIG. 2 is an enlarged plan view of the region surrounded by the dot-dash chain line A particularly illustrated in FIG. 1A. As shown in FIG. 2, the pixel 2 includes a plurality of photoelectric transducers 3, signal wirings 50, and a control circuit 4.

Figure 3:
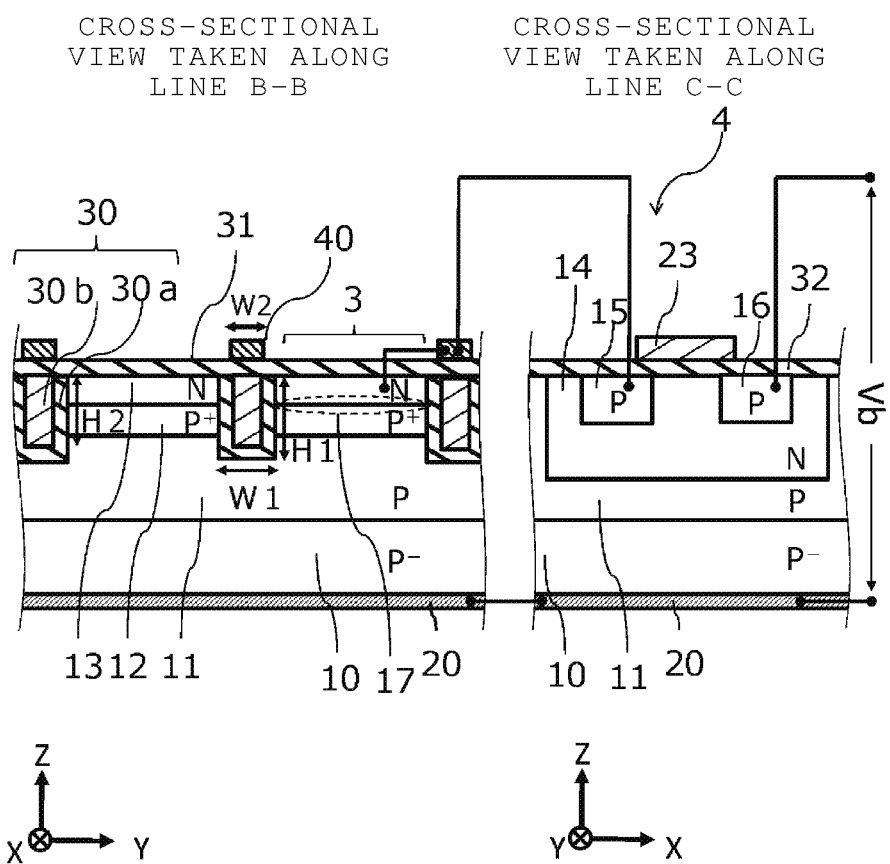
FIG. 3 is a cross-sectional view of a light receiving device in a first embodiment.

The photoelectric transducer 3 generates electron-hole pairs (carriers) when hit with light (photons) incident from an insulating film 31 side (see FIG. 3). As a photoelectric transducer 3 an avalanche photo diode (APD) is used, for example. The photoelectric transducers 3 are arranged in a planar manner in a direction along a semiconductor substrate 10 (see FIG. 3). In such a case, since the photoelectric transducers 3 each have the same rectangular shape, more photoelectric transducers 3 can be arranged within a fixed, predetermined area. The photoelectric transducers 3 are connected in parallel to each other by the signal wirings 50.

A photoelectric transducer 3 outputs a signal to the signal wiring 50 when a photon generates an electron-hole pair. The light receiving device 1 outputs the signal output from the photoelectric transducer 3 to the outside of the light receiving device 1, with the respective pixel 2 being considered one unit, via the signal wiring 50 and the control circuit 4.

The control circuit 4 is a circuit that controls an output state of the signal output from the pixel 2, and one control circuit 4 is provided for each pixel 2. In the first embodiment, an example in which the control circuit 4 is implemented as a metal oxide semiconductor field effect transistor (MOSFET) is described. The MOSFET is configured with a drain electrode 21, a source electrode 22, and a gate electrode 23. One control circuit 4 may be provided for each photoelectric transducer 3 in order to control the output state of the signal output from each photoelectric transducer 3.

Structure of a photoelectric transducer 3 and a control circuit 4 will be described with reference to FIGS. 2 and 3. FIG. 3 is a cross-sectional view of the light receiving device according to the first embodiment. The left side of FIG. 3 is a cross-sectional view taken along a line B-B of FIG. 2. The right side of FIG. 3 is a cross-sectional view taken along a line C-C of FIG. 2.

The photoelectric transducer 3 includes a semiconductor substrate 10, a P-type semiconductor layer 11, a P$^+$-type semiconductor layer 12, an N-type semiconductor layer 13, a metal film 20, an isolation area 30, an insulating film 31, a quench resistor 40, and wirings 51 and 52.

The semiconductor substrate 10 has one surface extending parallel to the XY plane and the other surface facing the one surface. The semiconductor substrate 10 has a P-type conductivity at a P$^-$-level dopant concentration. As the semiconductor substrate 10, for example, a single crystal silicon substrate may be used. A light receiving device 1 having an APD and a silicon semiconductor substrate 10 may be called a silicon photomultiplier (SiPM) in some contexts.

The metal film 20 is provided on the backside surface of the semiconductor substrate 10. The metal film 20 functions as a common electrode for respective photoelectric transducers 3. For the metal film 20, for example, Al, Cu, Au, or the like can be used.

The P-type semiconductor layer 11 is provided on one surface of the semiconductor substrate 10. The P-type semiconductor layer 11 has a P-level conductivity type. The P-level impurity concentration of the P-type semiconductor layer 11 is higher than the P$^-$-level impurity concentration of the semiconductor substrate 10. The P-level impurity concentration of the P-type semiconductor layer 11 is, for example, on the order of $10^{15}/cm^3$.

A plurality of P$^+$-type semiconductor layers 12 are provided on the P-type semiconductor layer 11. The P$^+$-level impurity concentration of the P$^+$-type semiconductor layers 12 is greater than the P-level impurity concentration of the P-type semiconductor layer 11. The P$^+$-level impurity concentration of the P$^+$-type semiconductor layer 12 is on the order of $10^{16}/cm^3$.

Each of a plurality of N-type semiconductor layers 13 is provided on a separate P$^+$-type semiconductor layer 12. The N-type semiconductor layer 13 has an N-type impurity concentration on the order of $10^{20}/cm^3$.

A portion where the P$^+$-type semiconductor layer 12 and the N-type semiconductor layer 13 are in contact forms a PN junction layer 17.

The insulating film 31 is an insulating material and is provided on the N-type semiconductor layer 13 and on an isolation area 30. For the insulating film 31, for example, a silicon oxide film is used. A photon incident on the insulating film 31 passes through the insulating film 31 and hits the N-type semiconductor layer 13 (more particularly the PN junction layer 17).

The isolation area 30 is provided between the P-type semiconductor layer 11 and the insulating film 31 in the Z-direction. The isolation area 30 extends from a position in contact with the insulating film 31 towards the metal film 20. The isolation area 30 separates adjacent photoelectric transducers 3 from each other, thereby preventing a carrier and a photon of one photoelectric transducer 3 from leaking to an adjacent photoelectric transducer 3, and thereby preventing crosstalk. In this context, "crosstalk" means that a photon, or the carrier generated when the photon is incident on the photoelectric transducer 3, affects an adjacent photoelectric transducer 3, and the signal indicating the detection of the incident photon is output from an adjacent photoelectric transducer 3 rather than the photoelectric transducer 3 on which the photon was actually incident. Crosstalk is one of possible factors that cause noise in a light receiving device 1.

The isolation area 30 includes at least an electrical isolation area 30a and an optical isolation area 30b. The isolation area 30 may further include a material used for a gate electrode 23.

The electrical isolation area 30a includes an insulating material, such as a silicon oxide film. The electrical isolation area 30a extends from a position in contact with the insulating film 31 towards the metal film 20. The electrical isolation area 30a is in contact with the insulating film 31, the P-type semiconductor layer 11, the P$^+$-type semiconductor layer 12, and the N-type semiconductor layer 13. An electrical isolation area 30a is provided between the P-type semiconductor layers 11 of adjacent photoelectric transducers 3, between the P$^+$-type semiconductor layers 12, and between the PN junction layers 17. The electrical isolation area 30a prevents crosstalk by preventing carriers of one photoelectric transducer 3 from leaking to an adjacent photoelectric transducer 3.

A width of the isolation area 30 (or more particularly the electrical isolation area 30a) is a width W1. In this specification, "width" refers to a dimension in the XY plane. The width W1 is equal to the distance between the adjacent photoelectric transducers 3 and is thus a distance over which carriers generated in one photoelectric transducer 3 could be attenuated between the adjacent photoelectric transducers 3 and thus prevented from reaching/affecting the adjacent photoelectric transducer 3. The width W1 is, for example, 0.5 µm to 1.8 µm.

The optical isolation area 30b is embedded in the electrical isolation area 30a. The optical isolation area 30b extends from a position in contact with the insulating film 31 to a position deeper (in the Z-axis direction) than a depth of the N-type semiconductor layer 13. The optical isolation area 30b prevents crosstalk by preventing/blocking a photon of one photoelectric transducer 3 from leaking to an adjacent photoelectric transducer 3.

The optical isolation area 30b contains the same conductive material as that of the gate electrode 23. As the conductive material contained in the optical isolation area 30b, a material which contains metal and has a low photon transmission property may be used. The type of the material may be changed as appropriate in accordance with intended characteristics of the control circuit 4 or the like.

A height H2 of the optical isolation area 30b is less than a height H1 of the electrical isolation area 30a. The height H2 is set so that the optical isolation area 30b is present between the PN junction layers 17 of adjacent photoelectric transducers 3. With this configuration, the optical isolation area 30b can effectively optically isolate the PN junction layer 17, in which a secondary photon can be generated in some instances, from the adjacent photoelectric transducer 3, and photonic crosstalk is thus prevented. The height H2 is, for example, 1.5 to 3 µm. A width W2 of the optical isolation area 30b is less than the width W1.

An opening 6 (see FIG. 2) is a portion between isolation areas 30 where the incidence of photons is not hindered by elements such as the signal wiring 50, the wirings 51, 52, and 53, and the quench resistor 40. When the area occupied by the quench resistor 40 or the like is reduced, a larger area for the opening 6 can be allocated.

The quench resistor 40 is provided on the insulating film 31. The quench resistor 40 contains, for example, polycrystalline silicon or a metal material. A resistance value of the quench resistor 40 is set to about several hundred kΩ, for example. The quench resistor 40 is formed in the isolation area 30 in the X-direction and the Y-direction, and is not formed outside the isolation area 30. The width W2 of the quench resistor 40 is smaller than the width W1. The quench resistor 40 is positioned immediately above the isolation area 30 in the Z-direction. The quench resistor 40 is within the perimeter (outer boundary) of the isolation area 30 in a plan view when viewed from the Z-direction.

The wiring 51 penetrates the insulating film 31 and is electrically connected to the N-type semiconductor layer 13 and the quench resistor 40. The wiring 52 is electrically connected to the quench resistor 40 and the signal wiring 50. The photoelectric transducers 3 of the same pixel 2 are connected in parallel via the metal film 20 and the signal wiring 50.

Next, the control circuit 4 will be described with reference to FIGS. 2 and 3. The control circuit 4 includes the semiconductor substrate 10, the P-type semiconductor layer 11, an N-type well layer 14, a P-type drain layer 15, a P-type source layer 16, an insulating film 32, the drain electrode 21, the source electrode 22, the gate electrode 23, and the wiring 53.

The N-type well layer 14 is an N-type semiconductor layer and is provided on the P-type semiconductor layer 11 provided on the semiconductor substrate 10. On the N-type well layer 14, a MOSFET composed of the drain electrode 21, the source electrode 22, and the gate electrode 23 is formed. The control circuit 4 including the MOSFET prevents current from flowing through the metal film 20 and the photoelectric transducer 3 adjacent to the control circuit 4.

The P-type drain layer 15 is a P-level semiconductor layer and is provided on the N-type well layer 14. The P-type drain layer 15 is separated from the P-type semiconductor layer 11. A part of the N-type well layer 14 is provided between the P-type drain layer 15 and the P-type semiconductor layer 11.

The P-type source layer 16 is a P-level semiconductor layer and is provided on the N-type well layer 14. The P-type source layer 16 is separated from the P-type semiconductor layer 11 and the P-type drain layer 15. A part of the N-type well layer 14 is provided between the P-type source layer 16 and the P-type semiconductor layer 11 and is also between the P-type source layer 16 and the P-type drain layer 15.

The insulating film 32 is made of an insulating material, for example, silicon oxide. The insulating film 32 is provided immediately above the N-type well layer 14 at least on a surface region between the P-type source layer 16 and the P-type drain layer 15. The insulating film 32 can cover the P-type drain layer 15 and the P-type source layer 16 in addition to the N-type well layer 14. The insulating film 32 may be formed integrally with the insulating film 31.

The drain electrode 21 is provided on the insulating film 32. The drain electrode 21 penetrates the insulating film 32 at least at certain positions and is thereby electrically connected to the P-type drain layer 15. The drain electrode 21 is electrically connected to the signal wiring 50 via the wiring 53.

The source electrode 22 is provided on the insulating film 32. The source electrode 22 also penetrates the insulating film 32 at least at certain positions and is electrically connected to the P-type source layer 16. The source electrode 22 is electrically connected to an element (e.g., a circuit element) outside the light receiving device 1. A high voltage applied between the metal film 20 and the source electrode 22 is applied to the photoelectric transducer 3 as a reverse bias voltage Vb. The output of the signal to the outside from the light receiving device 1 is performed via the source electrode 22.

The gate electrode 23 is provided on the insulating film 32. The gate electrode 23 is made of the same material containing metal as that of the optical isolation area 30b. An electrically conductive state of the control circuit 4 between the drain electrode 21 and the source electrode 22 is controlled by voltage applied to the gate electrode 23 and a channel that forms (or not) in the N-type well layer 14 in response to the gate electrode 23 voltage. By controlling the conductive state of the control circuit 4, a voltage to be applied to the photoelectric transducer 3 can be controlled.

It is noted that, in the structure of the control circuit 4, the insulating film 32 can be provided only immediately above the N-type well layer 14, the drain electrode 21 is provided in contact with the P-type drain layer 15, the source electrode 22 is provided in contact with the P-type source layer 16, and the gate electrode 23 is provided in contact with a portion of the insulating film 32 between the region of the P-type drain layer 15 and the region of the P-type source layer 16.

Operations of the light receiving device 1 will be described. The photoelectric transducer 3 is an APD and operates in Geiger mode. In the Geiger mode, a reverse bias voltage Vb higher than a breakdown voltage of the photoelectric transducer 3 is applied across a cathode (N-type semiconductor layer 13) and an anode (semiconductor substrate 10), and a strong electric field is formed in the PN junction layer 17 of the photoelectric transducer 3. Electron-hole pairs are generated in the PN junction layer 17 by photons that pass through the insulating film 31 and are injected into the photoelectric transducer 3. Of the electron-hole pairs, electrons drift to the N-type semiconductor layer 13 side and holes drift to the semiconductor substrate 10 side in response to the electric field. When a carrier with large energy collides with a crystal lattice element, ionization occurs where a new electron-hole pair is generated. A discharge phenomenon in which the ionization occurs in a chain is referred to as Geiger discharge.

When Geiger discharge occurs in the photoelectric transducer 3, the number of carriers is amplified by a chain of ionizations, but the amplification has an upper limit that depends on strength of the electric field. For that reason, when Geiger discharge occurs, a constant saturation output according to the strength of the electric field is generated in the photoelectric transducer 3. The Geiger discharge is terminated by the quench resistor 40, and the photoelectric transducer 3 outputs a pulse of the output current.

The quench resistor 40 causes a voltage drop when the output current due to a Geiger discharge of the photoelectric transducer 3 flows, and decreases the operating voltage of the photoelectric transducer 3. Geiger discharge stops due to a decrease in the operating voltage of the photoelectric transducer 3. When Geiger discharge occurs, the next photon can be detected by stopping the Geiger discharge with the quench resistor 40.

Among the photoelectric transducers 3 having a pixel 2, each of the photoelectric transducers 3 in which photons were incident on the PN junction layer 17 outputs a pulse of the same output current. The signal output from the photoelectric transducer 3 is integrated for each pixel 2 and outputs to the outside of the light receiving device 1 via the control circuit 4.

That is, each photoelectric transducer 3 detects that a photon was incident on the PN junction layer 17 using the Geiger discharge, and the pixel 2 outputs a signal corresponding to an amount of light incident on the pixel 2 based on the number of photoelectric transducers 3 that detect the photons. It is noted that even when a plurality of photons are incident on the same photoelectric transducer 3 and each photon generates an electron-hole pair, a constant saturation output according to strength of the electric field is generated from the photoelectric transducer 3. For that reason, an output current when a plurality of photons hit the same photoelectric transducer 3 and multiple electron-hole pairs are generated is the same as the output current when just one photon hits the same photoelectric transducer 3 and just one electron-hole pair is generated.

The control circuit 4 can control the ON/OFF of the reverse bias voltage Vb applied to the photoelectric transducer 3 by changing the conductive state of the MOSFET configured by the drain electrode 21, the source electrode 22, and the gate electrode 23. That is, the control circuit 4 can control whether or not the pixel 2 is allowed to detect a photon.

An example of a manufacturing method of the light receiving device 1 will be described with reference to FIGS. 4 to 10. FIGS. 4 to 10 are cross-sectional views illustrating aspects of an example manufacturing process of a light receiving device 1 according to a first embodiment. The left hand portion of FIGS. 4 to 10 are cross-sectional views taken along a position corresponding to line B-B in FIG. 2. The righthand portions of FIGS. 4 to 10 are cross-sectional views taken along a position corresponding to line C-C in FIG. 2.

Figure 4:
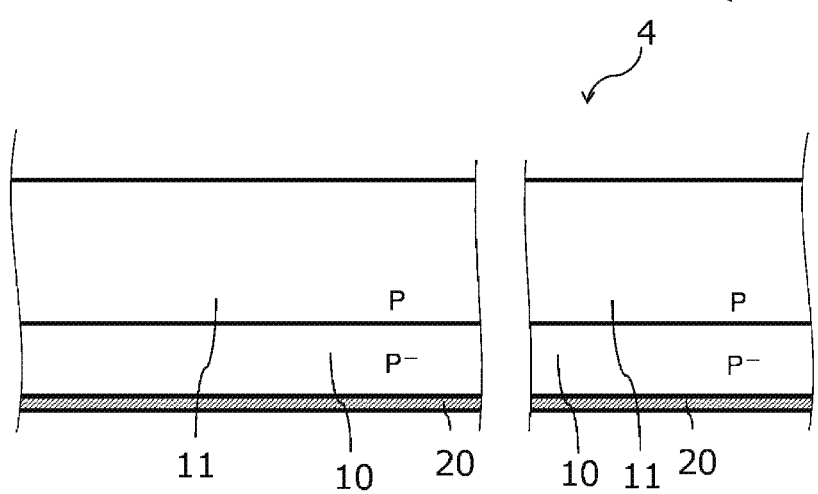
FIGS. 4-10 are a cross-sectional views illustrating aspects of a manufacturing process of a light receiving device according to a first embodiment.
Figure 4:
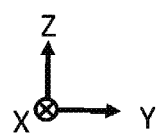
Figure 4:
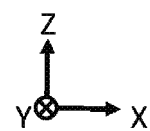

FIG. 4 depicts a wafer 5 before the isolation area 30 is formed. The wafer 5 includes the semiconductor substrate 10, the metal film 20, and the P-type semiconductor layer 11.

Figure 5:
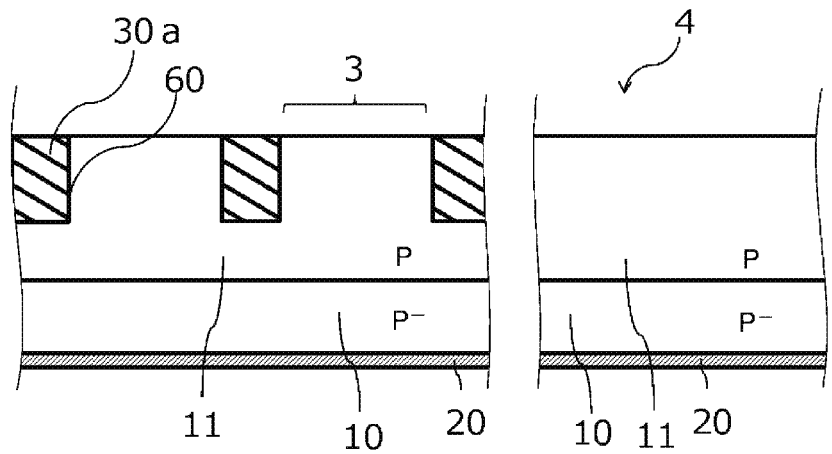
Figure 5:
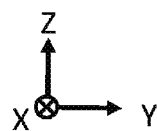
Figure 5:
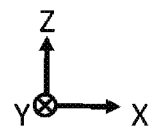

Next, as illustrated in FIG. 5, the electrical isolation areas 30a are formed. In general, a trench is formed in the P-type semiconductor layer 11 and an insulating material is embedded in the trench to form the electrical isolation area 30a. The trench is formed, for example, by etching the P-type semiconductor layer 11 after forming a patterned resist (etch mask) on the P-type semiconductor layer 11 using photolithography and etching processes. The insulating material is embedded in the trench by forming an insulating film covering the surface of the wafer 5 in which the trench has been formed and then removing an unnecessary (overfill) insulating film outside the trench by an etching back process or the like.

Figure 6:
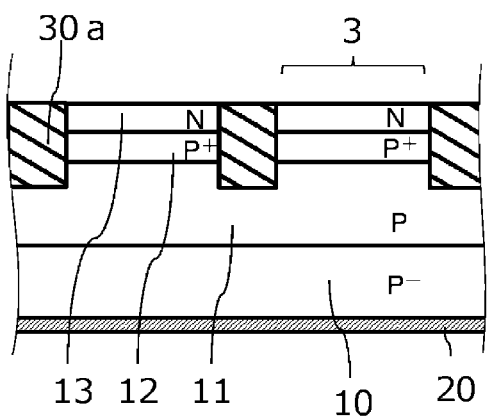
Figure 6:
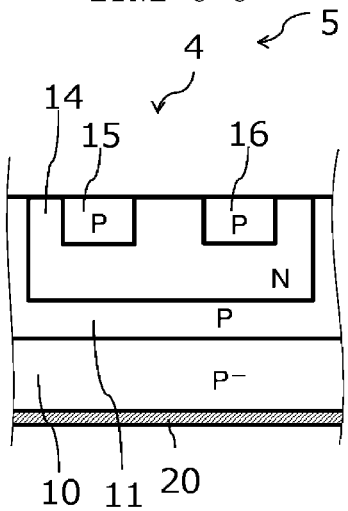

Next, as illustrated in FIG. 6, the $P^+$-type semiconductor layer 12, the N-type semiconductor layer 13, then N-type well layer 14, the P-type drain layer 15, and the P-type source layer 16 are formed. The P-type drain layer 15 and the P-type source layer 16 are spatially separated from each other, and a part of the N-type well layer 14 is between the P-type drain layer 15 and the P-type source layer 16. These semiconductor layers by ion implantation or the like of a donor impurity, such as P or As, or an acceptor impurity, such as B or $BF_2$, and followed by a step of thermally diffusing the implanted impurity. Implantation process may use a resist patterned (implant mask) using lithography and etching.

Figure 7:
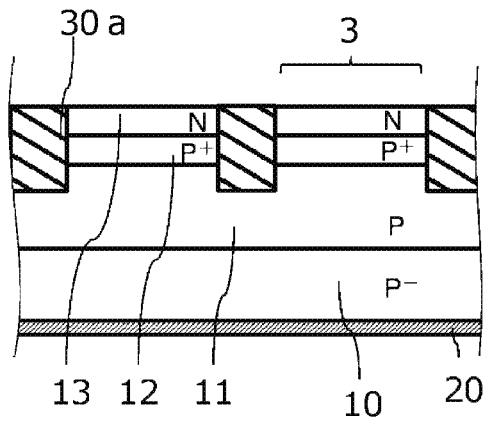
Figure 7:
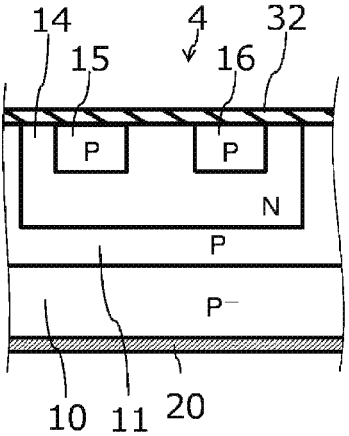

Next, as illustrated in FIG. 7, the insulating film 32 is formed on the N-type well layer 14 at least on a surface region between positions of the P-type drain layer 15 and the P-type source layer 16.

Figure 8:
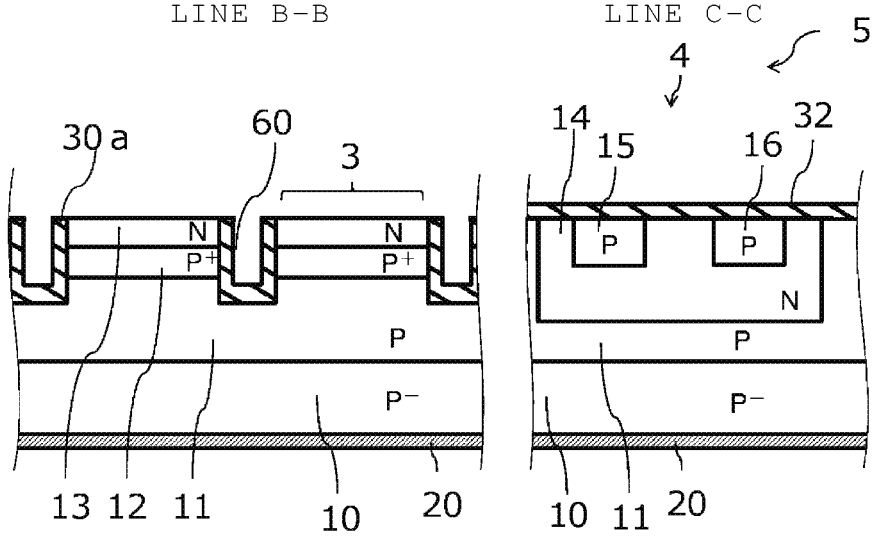

Next, as illustrated in FIG. 8, a trench is formed in the electrical isolation area 30a. As a method for forming this trench, a method similar to that used for forming the trench in the P-type semiconductor layer 11 can be used.

Figure 9:
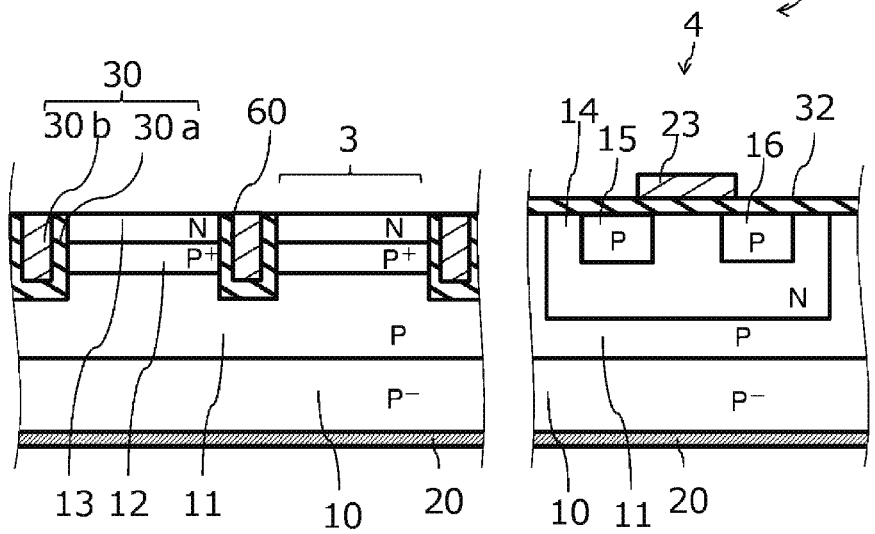

Next, as illustrated in FIG. 9, the optical isolation area 30b and the gate electrode 23 are formed. In this example, the optical isolation area 30b and the gate electrode 23 are obtained by first forming a conductive film on the wafer 5 from a conductive material and then patterning the conductive film. Vapor deposition (e.g., chemical vapor deposition) or sputtering can be used to form the conductive film. For patterning this conductive film, lithography and etching or metal-lift-off, a technique such as laser ablation, or a combination thereof may be used.

Figure 10:
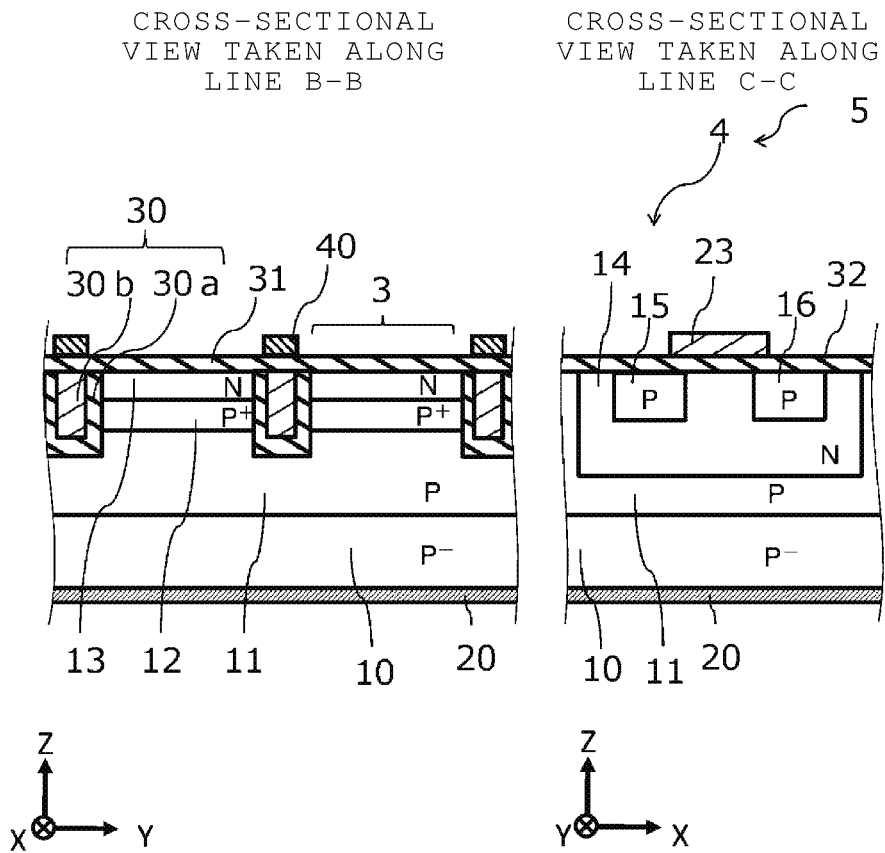

Next, as illustrated in FIG. 10, the insulating film 31 is formed to cover the N-type semiconductor layer 13 and the isolation area 30. Thereafter, the quench resistor 40 is formed at a position immediately above the isolation area 30 on top of the insulating film 31. A formation method of the quench resistor 40 can be appropriately selected depending on the material to be used for the quench resistor 40.

Thereafter, the light receiving device 1 can be manufactured by additional processing for forming the drain electrode 21, the source electrode 22, the signal wiring 50, and the wirings 51, 52, and 53 to provide the light receiving device 1 as depicted in FIGS. 2 and 3. Wirings and/or electrodes that are to be in electrical contact with various semiconductor layers by penetrating the insulating films 31 and 32 are formed by first forming a contact hole penetrating the insulating films 31 and 32 and then embedding a conductive material in the contact hole.

It is noted that in some examples, the drain electrode 21, the source electrode 22, the signal wiring 50, and the wirings 51, 52, and 53 can be simultaneously formed from the same material as that of the optical isolation area 30b and the gate electrode 23 according to the design of the light receiving device 1. With such a configuration, the number of steps in the manufacturing process of the light receiving device 1 can be further reduced.

The various effects obtained by providing the light receiving device 1 according to the first embodiment as a single package having the configuration as described above will be described below.

The light receiving device 1 cannot detect a photon unless a photon is incident on the PN junction layer 17 of the photoelectric transducer 3. If the ratio of the planar area of the opening 6 (or, alternatively, the planar area of the portion of the PN junction layer 17 on which the photon can be incident without being blocked by the various other constitutional elements other than the insulating film 31) to the overall planar area of the light receiving device 1 is large, the possibility that the photon incident on the light receiving device 1 will be detected increases, and light receiving sensitivity of the light receiving device 1 thus increases. In general, the light receiving device 1 is required to have high light receiving sensitivity.

In the light receiving device 1, the isolation area 30 prevents a carrier or photon of one photoelectric transducer 3 from leaking to an adjacent photoelectric transducer 3. With this configuration, crosstalk is prevented. The light receiving device 1 has the quench resistor 40, and thus a Geiger discharge that is generated in a photoelectric transducer 3 by photon detection can be stopped and thus the next incident photon can be detected. When isolation area 30 and quench resistor 40 are provided in the light receiving device 1, the ratio of the opening 6 to the area of the light receiving device 1 will be reduced by an amount corresponding to the combined areas occupied by the isolation area 30 and the quench resistor 40.

Thus, in the first embodiment, the quench resistor 40 is provided at a position immediately above the isolation area 30 of the insulating film 31. Since the quench resistor 40 thus does not further block the PN junction layer 17, a larger area for the opening 6 can be allocated in the light receiving device 1.

In the light receiving device 1 of the first embodiment, the pixel 2 and the control circuit 4 necessary for control of the pixel 2 are adjacently mounted on the same semiconductor substrate 10. For that reason, in the first embodiment, compared to the case where the pixel 2 and the control circuit 4 are provided separately, the total number of chips in the device can be reduced, and thus the area necessary for mounting the light receiving device 1 can be reduced. Since the mounting area of the light receiving device 1 is reduced, the ratio of the area of the opening 6 to the area of the light receiving device 1 is increased.

In the first embodiment, the quench resistor 40 is positioned within the isolation area 30 in a plan view in the Z-direction, but the present disclosure is not limited thereto. For example, so long as at least a part of the quench resistor 40 is positioned immediately above the isolation area 30 in the Z-direction, a larger area for the opening 6 of the light receiving device 1 can be allocated than would otherwise be the case.

As described above, in the light receiving device 1 of the first embodiment, since the pixel 2 and the control circuit are adjacently mounted and the quench resistor 40 is positioned at least partially overlapping the isolation 30, a larger area can be allocated to the opening 6 of the light receiving device 1, and the light receiving sensitivity can be kept high. With this configuration, it is possible to reduce noise due to crosstalk between adjacent photoelectric transducers 3 and provide a high light receiving sensitivity.

Also, in general, any material containing metal that might typically be used for the gate electrode 23 will have a low photon transmission property and will thus be sufficient for use in the optical isolation area 30b. For that reason, the optical isolation area 30b and the gate electrode 23 can be made of the same material, and the characteristics of the material can be selected according to the design parameters of the gate electrode 23. Since the same material is used for optical isolation area 30b and the gate electrode 23, these can be formed simultaneously (that is, in the same wafer/device processing steps). Accordingly, since various device elements (e.g., the optical isolation area 30b and the gate electrode 23) can be formed simultaneously, the light receiving device 1 according to the first embodiment can be manufactured with a fewer steps than otherwise.

Second Embodiment

Figure 11:
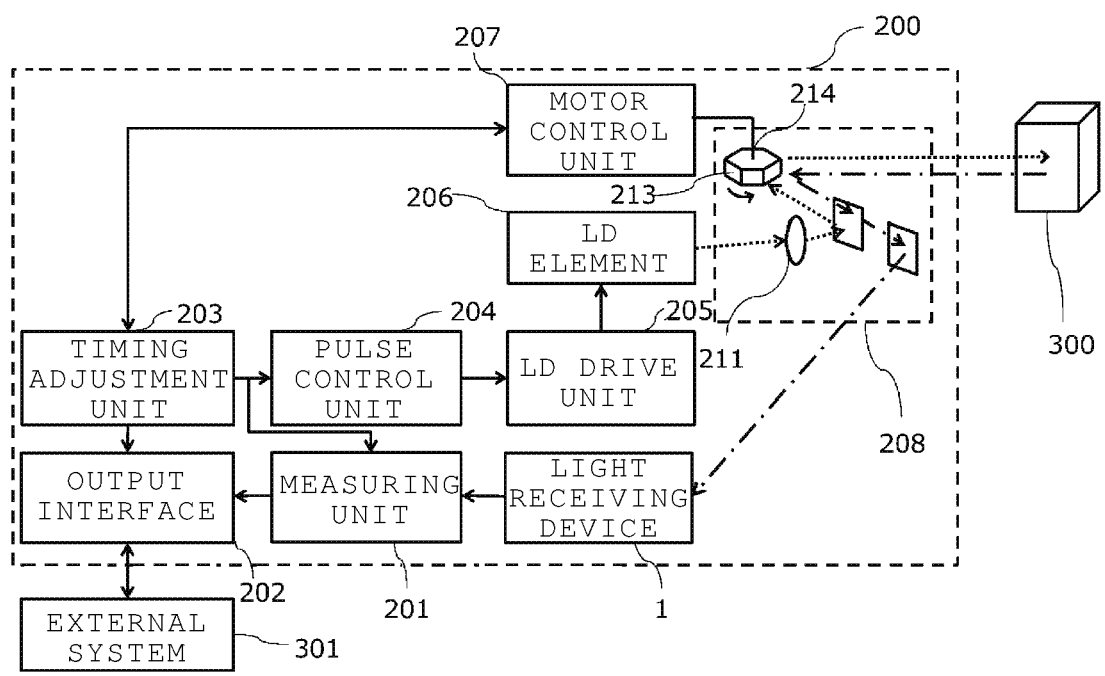
FIG. 11 is a block diagram illustrating an example of a configuration of a distance measuring apparatus according to a second embodiment.

A second embodiment is a distance measuring apparatus 200 in which a light receiving device 1 is incorporated. FIG. 11 is a block diagram illustrating an example configuration of a distance measuring apparatus 200 according to the second embodiment.

The distance measuring apparatus 200 is a light detection and ranging (LIDAR) apparatus. A LIDAR apparatus emits a pulse of laser light, measures the time until the light is reflected (off some object/target downrange) and returned, and calculates the distance to the point at which the light was reflected. The LIDAR apparatus is not only used as a distance measuring unit. A LIDAR apparatus can also be used for a digital imaging technique in which light is emitted in various directions and the various returned reflections of emitted light are used to establish positions of objects along the various directions. That is, an image or map of the surroundings of the LIDAR apparatus can be based on information such as an emission direction, a distance to a reflection point, and intensity of reflected light. The distance measuring apparatus 200 may be mounted on an automobile or a drone, for example.

In this example, the distance measuring apparatus 200 includes the light receiving device 1 described in the first embodiment, a measuring unit 201, an output interface 202, a timing adjustment unit 203, a pulse control unit 204, and a laser diode (LD) drive unit 205, a laser diode (LD) element 206, a motor control unit 207, an optical device 208.

An example of an operation of the distance measuring apparatus 200 of the second embodiment will be described as below.

The timing adjustment unit 203 adjusts the direction in which the laser pulse is emitted and the timing of light emission. The timing adjustment unit 203 provides this timing information to the measuring unit 201 and the output interface 202. Based on the timing as adjusted by the timing adjustment unit 203, the pulse control unit 204 instructs the LD drive unit 205 to output the output light as a pulse. The LD drive unit 205 supplies a current suitable for the output of the set pulse to the LD element 206, and the LD element 206 emits light. Based on the timing information given by the timing adjustment unit 203, the motor control unit 207 controls the operation of a motor 214 of the optical device 208 so that the output light of the LD element 206 is emitted in an appropriate direction at the appropriate timing. The optical device 208 includes a lens 211, a mirror 213, and the motor 214. The optical device 208 collimates the light emitted from the LD element 206 and emits the collimated light in an appropriate direction. The mirror 213 is attached to the motor 214. When the motor 214 is operated, an angle of the mirror 213 is changed, the angle at which the output light is incident and reflected on the mirror 213 is changed, and thus an output direction of the output light is adjusted. The emission angle is an angle formed by the direction in which the output light is emitted from the distance measuring apparatus 200 with respect to a predetermined reference direction.

The optical device 208 takes in reflected light returned when the output light hits a distance measurement target point 300, and the reflected light that is returned to the optical device 208 is sent to the light receiving device 1. The light receiving device 1 detects the reflected light and sends an electric signal to the measuring unit 201, the electric signal has a value corresponding to the number of photons detected by the light receiving device 1 upon receiving of the reflected light. Based on the timing information from the timing adjustment unit 203, the measuring unit 201 measures the emission angle of the output light and the time from when the output light was emitted until the reflected light was detected, and measures the distance from the distance measuring apparatus 200 to the distance measurement target point 300 on this basis. The output interface 202 outputs information measured by the measuring unit 201 to the outside of the distance measuring apparatus 200, for example, a computer capable of performing image processing.

Since the distance measuring apparatus 200 of the second embodiment uses a light receiving device 1 corresponding to the first embodiment, the distance measuring apparatus has a high light receiving sensitivity and noise due to crosstalk will be low. Therefore, the distance measuring apparatus 200 can be provide a more accurate distance measuring technique or more accurate digital image technique than otherwise.

The light receiving device 1 of the first embodiment can also be used in various applications for detecting light other than a distance measuring apparatus 200.

For example, the light receiving device 1 may be used for performing photon counting and/or light detection in various applications such as medical diagnostic equipment, positron emission tomography (PET), computerized tomography (CT), gamma camera (scintillation camera), industrial equipment, X-ray imaging devices, baggage inspection equipment, food inspection equipment, industrial measuring apparatus, integrated circuit (IC) inspection devices, laser scanners, biotechnology sensors and devices, fluorescence analysis devices, flow cytometry, DNA testing device, various spectroscopic analytic techniques, devices utilizing various spectroscopic analytic techniques, environmental analysis, oil exploration, radiation detection, and the like. The light receiving device 1 may be used in various applications in place of a photomultiplier tube (PMT).

For example, the light receiving device 1 may be used for infrared range finding and various sensor applications. The light receiving device 1 can be used in proximity sensors, Auto Focus (AF) devices, gesture control, automatic doors, people counting devices, security devices, and the like. A LIDAR system incorporating the light receiving device 1 can be mounted on an automobile, and can be used, for example, for automatic control of vehicle speed and brake system according to traffic conditions.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A light receiving device, comprising:
a first electrode;
a semiconductor substrate of a first conductivity type on the first electrode;
a first semiconductor region of the first conductivity type on the semiconductor substrate;
a plurality of second semiconductor regions of the first conductivity type arrayed on the first semiconductor region in a first direction;
a plurality of third semiconductor regions of a second conductivity type respectively on the plurality of second semiconductor regions;
a first isolation portion between each of the plurality of second semiconductor regions adjacent to each other in the first direction and between each of the plurality of third semiconductor regions adjacent to each other in the first direction, the first isolation portion being an electrical insulator;
a second isolation portion embedded in each of the first isolation portions, the second isolation portions comprising a metal;
a fourth semiconductor region of the second conductivity type on the first semiconductor region and spaced from the second semiconductor region in a second direction;
a pair of fifth semiconductor regions of the first conductivity type on the fourth semiconductor region spaced from each other in the second direction;
an insulating film on the fourth semiconductor region and the pair of fifth semiconductor regions; and
a second electrode on the insulating film between the pair of fifth semiconductor regions, the second electrode being comprised of the same metal as the second isolation portion.

2. The light receiving device according to claim 1, wherein the insulating film extends in the second direction from the fourth semiconductor region and covers the third semiconductor regions and the second isolation portions.

3. The light receiving device according to claim 2, further comprising: a resistor electrically connected between one of the plurality of third semiconductor regions and one of the pair of the fifth semiconductor regions, the resistor being on a portion of the insulating film above one of the second isolation portions in a third direction perpendicular to the first and second directions.

4. The light receiving device according to claim 3, wherein a width of the resistor in the first direction is less than a width of the first isolation portions in the first direction.

5. The light receiving device according to claim 2, further comprising:
a quench resistor electrically connected between one of the plurality of third semiconductor regions and one of the pair of the fifth semiconductor regions, the quench resistor being on a portion of the insulating film above one of the second isolation portions in a third direction that is perpendicular to the first and second directions; and
a control circuit connected to the second electrode and configured to switch a conduction state between the pair of fifth semiconductor regions by application of a voltage to the second electrode.

6. The light receiving device according to claim 1, wherein the second isolation portions extend in a third direction that is perpendicular to the first and second directions to a depth that is lower than a lowermost depth of the second semiconductor region in the third direction.

7. The light receiving device according to claim 1, wherein the semiconductor substate is silicon.

8. A light receiving device, comprising:
a first electrode;
a semiconductor substrate of a first conductivity type on the first electrode;
a plurality of photoelectric transducers arrayed on the semiconductor substrate in a first direction, each photo electric transducer comprising:
a first semiconductor region of the first conductivity type on the semiconductor substrate;
a second semiconductor region of the first conductivity type on the first semiconductor region;
a third semiconductor region of a second conductivity type on the second semiconductor region;
a first isolation region between each adjacent pair of photoelectric transducers, the first isolation region being an electrical insulator and between the first semiconductor regions, second semiconductor regions, and third semiconductor regions of the adjacent pair of photoelectric transducers;
a second isolation region embedded in each of the first isolation region, the second isolation region comprising a metal; and
a control circuit on the semiconductor substrate and electrically connected to a photoelectric transducer in the plurality of photoelectric transducer, the control circuit comprising:
a fourth semiconductor region of the second conductivity type on the first semiconductor region and spaced from the second semiconductor region in a second direction;
a pair of fifth semiconductor regions of the first conductivity type on the fourth semiconductor region spaced from each other in the second direction;
an insulating film on the fourth semiconductor region and the pair of fifth semiconductor regions; and
a second electrode on the insulating film between the pair of fifth semiconductor regions, the second electrode being comprised of the same metal as the second isolation region.

9. The light receiving device according to claim 8, wherein the insulating film extends in the second direction from the fourth semiconductor region and covers the third semiconductor regions and the second isolation regions.

10. The light receiving device according to claim 9, further comprising:

a quench resistor in the electrical connection between the control circuit and the photoelectric transducer, wherein
at least a portion of the quench resistor is on the insulating film at a position directly above one of the second isolation regions.

11. The light receiving device according to claim 8, further comprising:
a quench resistor in the electrical connection between the control circuit and the photoelectric transducer.

12. The light receiving device according to claim 8, wherein the semiconductor substrate is silicon.

13. The light receiving device according to claim 8, wherein the first isolation region is silicon oxide.

14. The light receiving device according to claim 8, further comprising:
a plurality of control circuits on the semiconductor substrate, each control circuit being respectively connected to one of the plurality of photoelectric transducers.

15. The light receiving device according to claim 8, wherein the second isolation region extends in a third direction that is perpendicular to the first and second directions to a depth that is lower than a lowermost depth of the second semiconductor region in the third direction.

16. A distance measuring apparatus, comprising:
a light receiving device according to claim 1;
a laser diode;
a laser diode drive unit that controls the laser diode to emit light; and
a measuring unit that calculates a time from when the light is emitted by the laser diode until reflected light is detected by the light receiving device, wherein
the light receiving device is positioned to receive light emitted by the laser diode after reflection from a distant object.

17. A method of manufacturing a light receiving device, comprising:
forming a first semiconductor region of a first conductivity type on a semiconductor substrate;
forming a plurality of second semiconductor regions of the first conductivity type provided arrayed on the first semiconductor region in a first direction;
forming a plurality of third semiconductor regions of a second conductivity type on each of the plurality of second semiconductor regions;
forming a first isolation portion between each of the plurality of second semiconductor regions adjacent to each other in the first direction and between each of the plurality of third semiconductor regions adjacent to each other in the first direction, the first isolation portion extending into the first semiconductor region, the first isolation portion being an electrical insulator;
forming a fourth semiconductor region of the second conductivity type on the first semiconductor region to be spaced from the second semiconductor region in a second direction;
forming a pair of fifth semiconductor regions of the first conductivity type on the fourth semiconductor region spaced from each other in the second direction;
forming an insulating film on the fourth semiconductor region and the pair of fifth semiconductor regions;
etching trench into the first isolation portion;
embedding a conductive material comprising a metal in the trench and depositing the conductive material on the insulating film a position between the pair of fifth semiconductor regions; and forming a second insulating film above the embedded conductive material in the trench.

18. The method of claim 17, further comprising:
forming a quench resistor on the second insulating film, the quench resistor including a portion above the conductive material embedded in the trench.

19. The method of claim 18, wherein the width of the portion of the quench resistor above the conductive material embedded in the trench is less than or equal to the width of the conductive material in the trench.

20. The method of claim 17, wherein the semiconductor substrate is silicon.

* * * * *